(12) United States Patent
Liu et al.

(10) Patent No.: US 12,514,056 B2
(45) Date of Patent: Dec. 30, 2025

(54) OLED DEVICE AND MANUFACTURING METHOD THEREFOR, AND DISPLAY PANEL

(71) Applicant: BOE Technology Group Co., Ltd., Beijing (CN)

(72) Inventors: Wenqi Liu, Beijing (CN); Qingyu Huang, Beijing (CN); Fudong Chen, Beijing (CN); Jinxiang Xue, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 370 days.

(21) Appl. No.: 18/271,047

(22) PCT Filed: Oct. 22, 2021

(86) PCT No.: PCT/CN2021/125602
§ 371 (c)(1),
(2) Date: Jul. 6, 2023

(87) PCT Pub. No.: WO2022/205850
PCT Pub. Date: Oct. 6, 2022

(65) Prior Publication Data
US 2024/0306419 A1    Sep. 12, 2024

(30) Foreign Application Priority Data

Mar. 30, 2021 (CN) .......................... 202110338798.0

(51) Int. Cl.
*H10K 50/816* (2023.01)
*H10K 59/12* (2023.01)
*H10K 59/122* (2023.01)
*H10K 59/35* (2023.01)
*H10K 71/00* (2023.01)
(Continued)

(52) U.S. Cl.
CPC ....... *H10K 50/816* (2023.02); *H10K 59/1201* (2023.02); *H10K 59/122* (2023.02); *H10K 59/35* (2023.02); *H10K 71/60* (2023.02); *H10K 71/621* (2023.02); *H10K 2102/351* (2023.02)

(58) Field of Classification Search
CPC .......................... H10K 50/816; H10K 50/818
USPC .................................................. 313/498–512
See application file for complete search history.

(56) References Cited

U.S. PATENT DOCUMENTS

| 2013/0292655 | A1 | 11/2013 | Becker et al. |
| 2018/0375058 | A1 | 12/2018 | Kawamura et al. |
| 2021/0057588 | A1 | 2/2021 | Xiong et al. |

(Continued)

FOREIGN PATENT DOCUMENTS

| CN | 103210519 A | 7/2013 |
| CN | 107579099 A | 1/2018 |

(Continued)

OTHER PUBLICATIONS

PCT/CN2021/125602 international search report.
CN202110338798.0 first office action.

*Primary Examiner* — Christopher M Raabe
(74) *Attorney, Agent, or Firm* — IPro, PLLC

(57) ABSTRACT

An OLED device is provided. The OLED device includes: an anode, a light emitting layer, and a cathode; wherein the anode includes an interstitial compound layer, a metal layer, and a graphene layer stacked sequentially in a direction approaching the light emitting layer.

18 Claims, 2 Drawing Sheets

(51) Int. Cl.
*H10K 71/60* (2023.01)
*H10K 102/00* (2023.01)

(56) References Cited

U.S. PATENT DOCUMENTS

| | | | |
|---|---|---|---|
| 2021/0242428 A1 | 8/2021 | Nishimura et al. | |
| 2022/0024770 A1 | 1/2022 | Zhang | |
| 2023/0030283 A1 | 2/2023 | Chen et al. | |
| 2024/0105946 A1* | 3/2024 | You | H01M 4/587 |
| 2025/0024722 A1* | 1/2025 | Nakamura | H05B 33/12 |
| 2025/0250481 A1* | 8/2025 | Ha | C09K 11/565 |

FOREIGN PATENT DOCUMENTS

| | | | |
|---|---|---|---|
| CN | 108134013 A | 6/2018 | |
| CN | 108369992 A | 8/2018 | |
| CN | 110034242 A | 7/2019 | |
| CN | 110518117 A | 11/2019 | |
| CN | 111893436 A | 11/2020 | |
| CN | 112136363 A | 12/2020 | |
| CN | 112186124 A | 1/2021 | |
| CN | 113097397 A | 7/2021 | |

\* cited by examiner

OLED DEVICE AND MANUFACTURING METHOD THEREFOR, AND DISPLAY PANEL

CROSS-REFERENCE TO RELATED APPLICATION

This application is a US national phase application based on PCT/CN2021/125602, filed on Oct. 22, 2021, which claims priority to Chinese Patent Application No. 202110338798.0, filed on Mar. 30, 2021, and entitled "OLED device and manufacturing method therefor, and display panel", the disclosures of which are incorporated herein by reference in their entireties.

TECHNICAL FIELD

The present application related the field of display technology, and in particular to an OLED device and a method for manufacturing thereof, and a display panel.

BACKGROUND OF THE INVENTION

When a current is passed through Organic Light-Emitting Diodes (OLEDs), the holes produced by the anode and the electrons produced by the cathode compound in the light emitting layer and release light. Based on the excitation energy, photons of different energies can be emitted, corresponding to different colors of light.

SUMMARY OF THE INVENTION

According to some embodiments of the present disclosure, an OLED device is provided. The OLED device includes an anode, a light emitting layer and a cathode. According to some embodiments of the present disclosure, the anode includes an interstitial compound layer, a metal layer and a graphene layer stacked sequentially in a direction approaching the light emitting layer.

According to embodiments of the present disclosure, the interstitial compound layer includes at least one of titanium nitride, titanium carbide, and zirconium carbide; and the metal layer includes silver.

According to embodiments of the present disclosure, a plurality of bumps are defined on a surface, close to the light emitting layer, of the interstitial compound layer.

According to embodiments of the present disclosure, the bumps satisfy at least one of the following conditions: a height of the bumps ranging from 50 to 200 nm; a width of the bumps ranging from 50 to 500 nm; a distance between two adjacent bump ranging from 50 to 100 nm in one sub-pixel; and each the bumps being in the shape of a hemisphere or a cube.

According to embodiments of the present disclosure, a thickness of the interstitial compound layer ranges from 5 to 50 nm and a thickness of the metal layer ranges from 50 to 200 nm.

According to embodiments of the present disclosure, the OLED device includes a red OLED device, a blue OLED device and a green OLED device, a thickness of the graphene layer of the red OLED device, a thickness of the graphene layer of the blue OLED device and a thickness of the graphene layer of the green OLED device are different form one another.

According to embodiments of the present disclosure, a thickness of the graphene layer of the red OLED device ranges from 10 to 100 nm, a thickness of the graphene layer of the blue OLED device ranges from 10 to 100 nm, and a thickness of the graphene layer of the green OLED device ranges from 10 to 100 nm.

According to embodiments of the present disclosure, the OLED device further includes a pixel defining layer, having a plurality of openings therein and arranged on a surface, distal from the interstitial compound layer, of the metal layer, wherein the graphene layer is arranged on the surface, distal from the interstitial compound layer, of the metal layer and is within the openings.

According to some embodiments of the present disclosure, a method for manufacturing the above OLED device is provided, including a step of forming the anode, the light emitting layer and the cathode. According to some embodiments of the present disclosure, the method for forming the anode includes: acquiring the anode by forming the interstitial compound layer, the metal layer and the graphene layer sequentially in the direction approaching the light emitting layer.

According to embodiments of the present disclosure, the interstitial compound layer is formed by: forming a planar interstitial compound layer by CVD or magnetron sputtering deposition, and forming the interstitial compound layer having a surface with a bump structure by nanoimprinting one surface of said planar interstitial compound layer; the metal layer is formed by magnetron sputtering; and the graphene layer is formed by printing a graphene sol on a surface of the metal layer by inkjet printing and solidifying the graphene sol to acquire the graphene layer.

In still another aspect of the present disclosure, a display panel is provided. According to some embodiments of the present disclosure, the display panel includes the above OLED device.

BRIEF DESCRIPTION OF DRAWINGS

The foregoing and/or additional aspects and advantages of the present disclosure will become apparent and readily understood from the description of the embodiments in conjunction with the accompanying drawings below, wherein.

DETAILED DESCRIPTION

The embodiments of the present disclosure will be explained below in conjunction with the embodiments. It will be understood by those skilled in the art that the following embodiments are intended to illustrate the present disclosure only and should not be considered as limiting the scope of the present disclosure. The specific techniques or conditions not indicated in the embodiments follow the techniques or conditions described in literature in the art or follow the product specification. The reagents or instruments used not specified manufacturers are conventional products available commercially.

The cathodes of OLED devices are usually made by evaporation or sputtering of low power function metals, such as aluminum, magnesium and silver. The anodes of OLED devices are usually composite structures of ITO/Ag/ITO. However, ITO/Ag/ITO reflector electrodes have problems of low optical coupling output efficiency, poor ductility for flexible applications, lack of resources and mismatch of work functions, etc.

Figure 1:
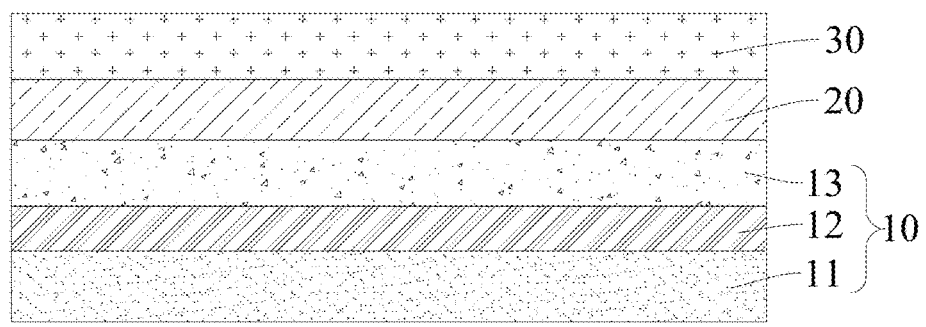
FIG. 1 is a schematic diagram of the structure of an OLED device according to an embodiment of the present disclosure.

In one aspect of the present disclosure, the present disclosure provides an OLED device. With reference to FIG. 1, the OLED device includes an anode 10, a light emitting layer 20 and a cathode 30. According to some embodiments of the present disclosure, the anode 10 includes an interstitial compound layer 11, a metal layer 12 and a graphene layer 13 stacked sequentially in the direction approaching the light emitting layer 20. The anode of the above structure enables the OLED device to have high optical coupling output characteristics. Specifically, the interstitial compound layer itself has excellent flatness, which can effectively improve the coupling output efficiency of the device compared to a planar ITO/Ag/ITO structure. The interstitial compound has the metal infiltration property that can be used as a nucleation film layer for the metal layer, such that the metal layer grown on its surface forms a stable structure (preventing the generation of island structure). The interstitial compound layer also has thermal resistance as well as electrical conductivity, which reduces the heat of the OLED device and provides sufficient carriers. The metal layer serves as a reflective layer can effectively adjust the optical properties and further enhance the luminescence efficiency and color point of different luminescent color OLED devices, improving the color gamut and efficiency of OLED devices.

Figure 2:
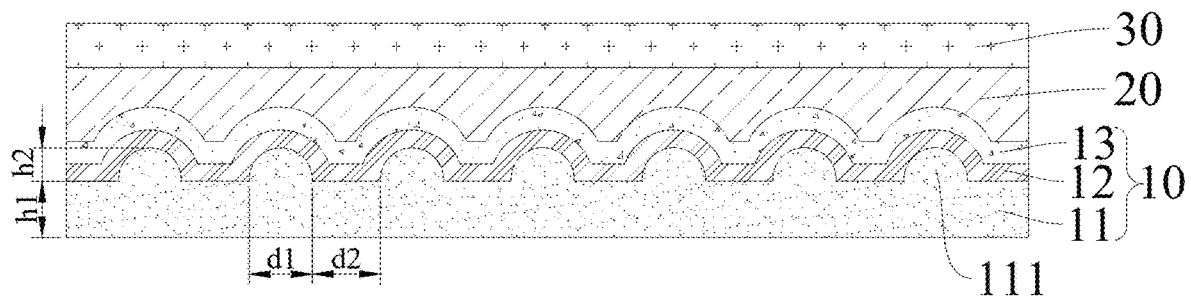
FIG. 2 is a schematic diagram of the structure of an OLED device according to another embodiment of the present disclosure.
Figure 3:
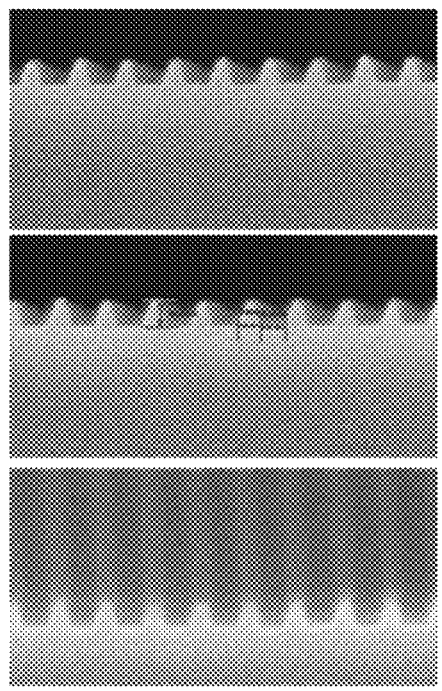
FIG. 3 is a scanning electron microscope view of an interstitial compound layer according to another embodiment of the present disclosure.
Figure 4:
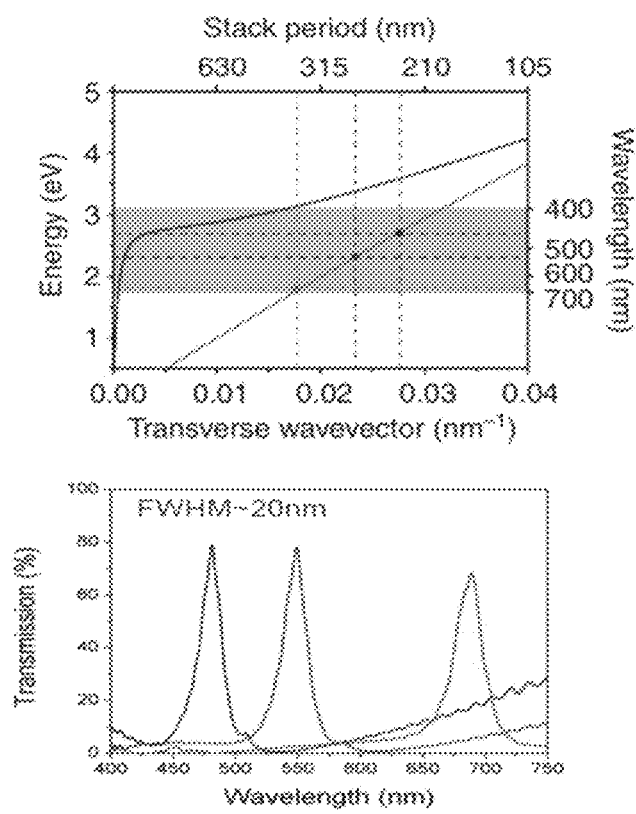
FIG. 4 is a curve between the light wave modal distribution of the bump structure of the interstitial compound layer and the bump structure, and a color transmission spectrogram of different color OLED devices.

According to some embodiments of the present disclosure, with reference to FIG. 2, a plurality of bumps 111 are defined on the surface, close to the light emitting layer 20, of the interstitial compound layer 11. Therefore, the surface of the interstitial compound layer 11 having bumps can form a micro-nano grating structure, which in turn facilitates light extraction of the OLED device. In some specific embodiments, the scanning electron microscope view of the interstitial compound layer 11 can be referred to FIG. 3, and the curve between the light wave modal distribution of the bump structure of the interstitial compound layer and the bump structure can be referred to the upper diagram of FIG. 4 (where the lower horizontal coordinate is the wavelength derivative, the upper horizontal coordinate is the stacking period, the left vertical coordinate is the energy, and the right vertical coordinate is the wavelength). The color transmission spectrogram of different color OLED devices can be referred to the lower diagram of FIG. 4 (where the horizontal coordinate is the wavelength and the vertical coordinate is the transmittance).

Figure 5:
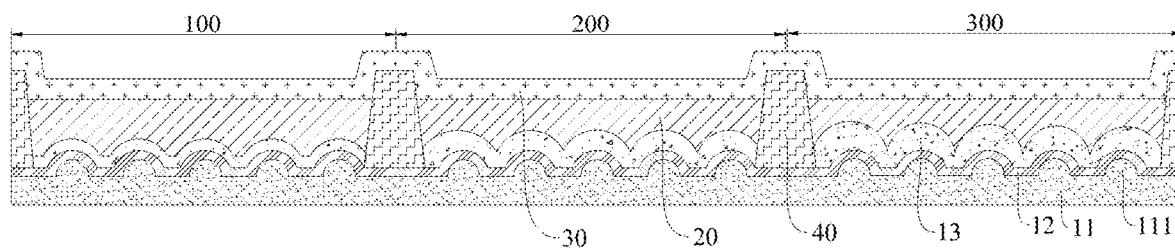
FIG. 5 is a schematic diagram of the structure of an OLED device according to yet another embodiment of the present disclosure.

According to some embodiments of the present disclosure, referring to FIG. 5, the OLED device further includes a pixel defining layer 40, having a plurality of openings therein. The pixel defining layer 40 is arranged on a surface, distal from the interstitial compound layer 11, of the metal layer 20, wherein the graphene layer 30 is arranged on a surface, distal from the interstitial compound layer, of the metal layer 20 and is within the openings.

According to some embodiments of the present disclosure, materials of the interstitial compound layer include at least one of titanium nitride, titanium carbide and zirconium carbide. The above materials have excellent flatness, which can effectively improve the coupling output efficiency of the device. The above materials also have the metal infiltration property that can be used as a nucleation film layer for the metal layer, such that the metal layer grown on its surface forms a stable structure and the generation of island structure is prevented.

According to some embodiments of the present disclosure, as shown in FIG. 2, the thickness h1 of the interstitial compound layer ranges from 5 to 50 nm, such as 5 nm, 10 nm, 15 nm, 20 nm, 25 nm, 30 nm, 35 nm, 40 nm, 45 nm, 50 nm. The interstitial compound layer has better performance and helps to acquire an anode structure with better performance. It should be noted that the thickness of the interstitial compound layer does not include the height of the bump.

According to some embodiments of the present disclosure, the bumps satisfy at least one of the following conditions: a height of the bumps ranging from 50 to 200 nm, such as 50 nm, 80 nm, 100 nm, 120 nm, 140 nm, 150 nm, 180 nm, 200 nm; a width of the bumps ranging from 50 to 500 nm, such as 50 nm, 80 nm, 100 nm, 120 nm, 140 nm, 150 nm, 180 nm, 200 nm, 250 nm, 300 nm, 350 nm, 400 nm, 450 nm, 500 nm; and a distance between two adjacent bump ranging from 50 to 100 nm in one sub-pixel, such as 50 nm, 60 nm, 70 nm, 80 nm, 90 nm, 100 nm. In this way, the bumps of the above dimensions can effectively improve the light removal of the device.

According to some embodiments of the present disclosure, each of the bumps is in the shape of hemisphere or a cube, facilitating the process of making the implementation.

According to some embodiments of the present disclosure, materials of the metal layer include silver, which has better electrical conductivity and ensures good anode performance.

According to some embodiments of the present disclosure, the thickness of the metal layer ranges from 50 to 200 nm, such as 50 nm, 80 nm, 100 nm, 120 nm, 140 nm, 150 nm, 180 nm, 200 nm. In this way, the above thickness of the metal layer can effectively ensure good performance of the anode. It should be noted that the thickness of the metal layer is set in equal thickness.

According to some embodiments of the present disclosure, the OLED device includes a red OLED device 100, a blue OLED device 200 and a green OLED device 300, a thickness of the graphene layer 13 of the red OLED device 100, a thickness of the graphene layer 13 of the blue OLED device 200 and a thickness of the graphene layer 13 of the green OLED device 300 are different from one another. In this way, the thickness of the graphene layer can be flexibly set based on the requirements of the cavity length of the microcavity structure of the OLED devices with different light emitting colors. The surface, close to the light emitting layer, of the graphene layer is used as the reflecting surface to acquire the required cavity length. The thickness of the anode can be effectively adjusted by designing the anode in different dimensions to reflect and transmit light therein, thus achieving the effect of selecting and gaining narrow wavelengths. The cavity length of the microcavity structure is the distance between the surface, close to the light emitting layer, of the anode and the surface, close to the light emitting layer, of the cathode. In a specific embodiment, the maximum gain cavity lengths of the blue OLED device, the green OLED device and the red OLED device are 190 nm, 235 nm and 285 nm respectively.

In some embodiments, a thickness of the graphene layer of the red OLED device ranges from 10 to 100 nm, a thickness of the graphene layer of the blue OLED device ranges from 10 to 100 nm, and a thickness of the graphene layer of the green OLED device ranges from 10 to 100 nm. In some specific embodiments, taking a thickness of 10 nm for the graphene layer of the blue OLED device as a benchmark, the thicknesses of the graphene layers of green OLED devices and red OLED devices are 235-190 nm and 285-190 nm respectively.

According to some embodiments of the present disclosure, the materials of the pixel defining layer, the light emitting layer and the cathode have no special requirements and can be flexibly selected by a person skilled in the art according to conventional technical means in the prior art, without limiting the requirements. Further, the OLED device includes structures such as electron transport layer, electron injection layer, hole transport layer and hole injection layer to improve the light emitting performance of the OLED device.

In another aspect of the present disclosure, a method for manufacturing the above OLED device is provided, including a step of forming the anode, the light emitting layer and the cathode. According to some embodiments of the present disclosure, the method for forming the anode includes: acquiring the anode by forming the interstitial compound layer, the metal layer and the graphene layer sequentially in the direction approaching the light emitting layer. The anode formed by the above method enables the OLED device to have high optical coupling output characteristics. Specifically, the interstitial compound layer itself has excellent flatness, which can effectively improve the coupling output efficiency of the device compared to a planar ITO/Ag/ITO structure. The interstitial compound has the metal infiltration property that can be used as a nucleation film layer for the metal layer, such that the metal layer grown on its surface forms a stable structure (preventing the generation of island structure). The interstitial compound layer also has thermal resistance as well as electrical conductivity, which reduces the heat of the OLED device and provides sufficient carriers. The metal layer serves as a reflective layer can effectively adjust the optical properties and further enhance the luminescence efficiency and color point of different luminescent color OLED devices, improving the color gamut and efficiency of OLED devices.

According to some embodiments of the present disclosure, the interstitial compound layer is formed by: forming a planar interstitial compound layer by CVD or magnetron sputtering deposition, and forming the interstitial compound layer having a surface with a bump structure by nanoimprinting one surface of said planar interstitial compound layer. In this way, the preparation of the interstitial compound layer by a nanoimprinting process, compared with methods such as etching, significantly reduces fabrication costs and process procedures and improve the dimensional accuracy of the interstitial compound layer surface bumps.

According to some embodiments of the present disclosure, the metal layer is formed by magnetron sputtering. This method is a mature and easy-to-manage process, which facilitates automated management as well as industrial production.

According to some embodiments of the present disclosure, the graphene layer is formed by printing a graphene sol on a surface of the metal layer by inkjet printing and solidifying the graphene sol to acquire the graphene layer. Using graphene sols as well as printing makes it easy to control the thickness of the graphene layers and acquire the desired thickness of the graphene layers. According to some embodiments of the present disclosure, According to some embodiments of the present disclosure, the method for manufacturing the OLED device further includes the step of forming a pixel defining layer 40. In the case that the metal layer 12 is formed, a pixel defining layer 40 is formed on the surface, distal from the interstitial compound layer 11, of the metal layer 12, and the pixel defining layer defines a plurality of openings within which a graphene layer 13 is formed, the structure of which can be schematically illustrated with reference to FIG. 5. The specific method for forming the pixel defining layer does not have special requirements and can be chosen flexibly by those skilled in the art based on practical needs and is not limited on this page.

According to some embodiments of the present disclosure, the method for manufacturing the OLED device described above can be applied to manufacture the OLED device previously described, wherein the requirements for the structure of the interstitial compound layer, the bump, the metal layer, the graphene layer, and the pixel defining layer are the same as those described previously and are repeated herein.

In still another aspect of the present disclosure, a display panel is provided. According to some embodiments of the present disclosure, the display panel includes the above OLED device. The OLED device of the display panel has a high optical coupling output characteristics, which in turn improves the overall performance of the display panel. It is to be understood by those skilled in the art that the display panel has all the features and advantages of the OLED device described earlier, and is not repeated herein in detail.

In the description of this specification, reference to the terms "an embodiment", "some embodiments", "example", "specific example", or "some examples" indicates that specific features, structures, materials, or characteristics described in conjunction with the embodiment or example are included in at least one embodiment or example of the present disclosure. In this specification, the schematic expressions of the above terms need not refer to the same embodiment or example. Furthermore, the specific features, structures, materials or characteristics described may be combined in a suitable manner in any one or more of the embodiments or examples. Furthermore, without contradicting each other, a person skilled in the art may combine and combine the different embodiments or examples described in this specification and the features of the different embodiments or examples.

Although embodiments of the present disclosure have been shown and described above, it is understood that the above embodiments are exemplary and are not to be construed as limiting the present disclosure. Variations, modifications, replacements and variants of the above embodiments can be made by those of ordinary skill in the art within the scope of the present disclosure.

What is claimed is:

1. An OLED device, comprising: an anode, a light emitting layer, and a cathode;
    wherein the anode comprises an interstitial compound layer, a metal layer, and a graphene layer stacked sequentially in a direction approaching the light emitting layer.

2. The OLED device according to claim 1, wherein the interstitial compound layer comprises at least one of titanium nitride, titanium carbide, and zirconium carbide; and the metal layer comprises silver.

3. The OLED device according to claim 1, wherein a plurality of bumps are defined on a surface, close to the light emitting layer, of the interstitial compound layer.

4. The OLED device according to claim 3, wherein the bumps satisfy at least one of the following conditions:
a height of each of the bumps ranges from 50 to 200 nm;
a width of each of the bumps ranges from 50 to 500 nm;
a distance between adjacent two of the bumps ranges from 50 to 100 nm in one sub-pixel; and
each of the bumps is in the shape of a hemisphere or a cube.

5. The OLED device according to claim 3, wherein a thickness of the interstitial compound layer ranges from 5 to 50 nm, and a thickness of the metal layer ranges from 50 to 200 nm.

6. The OLED device according to claim 1, comprising: a red OLED device, a blue OLED device, and a green OLED device; and a thickness of the graphene layer of the red OLED device, a thickness of the graphene layer of the blue OLED device, and a thickness of the graphene layer of the green OLED device are different from one another.

7. The OLED device according to claim 6, wherein a thickness of the graphene layer of the red OLED device ranges from 10 to 100 nm, a thickness of the graphene layer of the blue OLED device ranges from 10 to 100 nm, and a thickness of the graphene layer of the green OLED device ranges from 10 to 100 nm.

8. The OLED device according to claim 1, further comprising:
a pixel defining layer, having a plurality of openings therein and arranged on a surface, distal from the interstitial compound layer, of the metal layer, wherein the graphene layer is arranged on the surface, distal from the interstitial compound layer, of the metal layer and is within the openings.

9. A method for manufacturing an OLED device, wherein the OLED device comprises: an anode, a light emitting layer, and a cathode; wherein the anode comprises an interstitial compound layer, a metal layer, and a graphene layer stacked sequentially in a direction approaching the light emitting layer; wherein
the method comprises forming the anode, the light emitting layer, and the cathode, wherein forming the anode comprises:
acquiring the anode by forming the interstitial compound layer, the metal layer, and the graphene layer sequentially in the direction approaching the light emitting layer.

10. The method according to claim 9, wherein forming the interstitial compound layer comprises forming a planar interstitial compound layer by CVD or magnetron sputtering deposition, and forming the interstitial compound layer having a surface with a bump structure by nanoimprinting a surface of the planar interstitial compound layer;
the metal layer is formed by magnetron sputtering; and the graphene layer is formed by printing a graphene sol on a surface of the metal layer by inkjet printing and solidifying the graphene sol to acquire the graphene layer.

11. A display panel, comprising an OLED device;
wherein the OLED device comprises: an anode, a light emitting layer, and a cathode;
wherein the anode comprises an interstitial compound layer, a metal layer, and a graphene layer stacked sequentially in a direction approaching the light emitting layer.

12. The display panel according to claim 11, wherein the interstitial compound layer comprises at least one of titanium nitride, titanium carbide, and zirconium carbide; and the metal layer comprises silver.

13. The display panel according to claim 11, wherein a plurality of bumps are defined on a surface, close to the light emitting layer, of the interstitial compound layer.

14. The display panel according to claim 13, wherein the bumps satisfy at least one of the following conditions:
a height of each of the bumps ranges from 50 to 200 nm;
a width of each of the bumps ranges from 50 to 500 nm;
a distance between adjacent two of the bumps ranges from 50 to 100 nm in one sub-pixel; and
each of the bumps is in the shape of a hemisphere or a cube.

15. The display panel according to claim 13, wherein a thickness of the interstitial compound layer ranges from 5 to 50 nm, and a thickness of the metal layer ranges from 50 to 200 nm.

16. The display panel according to claim 11, wherein the OLED device comprises: a red OLED device, a blue OLED device, and a green OLED device; and a thickness of the graphene layer of the red OLED device, a thickness of the graphene layer of the blue OLED device, and a thickness of the graphene layer of the green OLED device are different from one another.

17. The display panel according to claim 16, wherein a thickness of the graphene layer of the red OLED device ranges from 10 to 100 nm, a thickness of the graphene layer of the blue OLED device ranges from 10 to 100 nm, and a thickness of the graphene layer of the green OLED device ranges from 10 to 100 nm.

18. The display panel according to claim 11, wherein the OLED device further comprises:
a pixel defining layer, having a plurality of openings therein and arranged on a surface, distal from the interstitial compound layer, of the metal layer, wherein the graphene layer is arranged on the surface, distal from the interstitial compound layer, of the metal layer and is within the openings.

* * * * *